(12) United States Patent
Tamaki

(10) Patent No.: US 10,892,351 B2
(45) Date of Patent: Jan. 12, 2021

(54) SEMICONDUCTOR DEVICE

(71) Applicant: KABUSHIKI KAISHA TOSHIBA, Tokyo (JP)

(72) Inventor: Tomohiro Tamaki, Nonoichi Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/447,125

(22) Filed: Mar. 2, 2017

(65) Prior Publication Data

US 2018/0083131 A1 Mar. 22, 2018

(30) Foreign Application Priority Data

Sep. 20, 2016 (JP) .................................. 2016-182773

(51) Int. Cl.
*H01L 29/08* (2006.01)
*H01L 29/739* (2006.01)
(Continued)

(52) U.S. Cl.
CPC ...... *H01L 29/7397* (2013.01); *H01L 27/0623* (2013.01); *H01L 29/0696* (2013.01);
(Continued)

(58) Field of Classification Search
CPC .............. H01L 29/063; H01L 29/7813; H01L 29/0696; H01L 29/1608; H01L 29/1095;
(Continued)

(56) References Cited

U.S. PATENT DOCUMENTS 5,162,876 A * 11/1992 Kitagawa ............ H01L 29/0804
257/133
6,891,224 B2  5/2005 Ogura et al.
(Continued)

FOREIGN PATENT DOCUMENTS

JP  H0430476 A  2/1992
JP  3919591 B2  5/2007
(Continued)

OTHER PUBLICATIONS

Japanese Office Action dated May 7, 2019, mailed in counterpart Japanese Application No. 2016-182773, 12 pages (with translation).
(Continued)

*Primary Examiner* — Moin M Rahman
(74) *Attorney, Agent, or Firm* — Kim & Stewart LLP

(57) ABSTRACT

A semiconductor device includes a first semiconductor region of first conductivity type, a second semiconductor region of second conductivity type, a third semiconductor region of second conductivity type, a first electrode, a fourth semiconductor region of second conductivity type, a fifth semiconductor region of first conductivity type, a gate electrode, a sixth semiconductor region of second conductivity type, and second and third electrodes. The second and third semiconductor regions are formed below the first semiconductor region. A second conductivity type carrier concentration of the third semiconductor region is lower than that of the second semiconductor region. The gate electrode faces the fourth semiconductor region. The sixth semiconductor region is formed above the first semiconductor region and is located above the third semiconductor region. The second electrode is electrically connected to the third electrode and extends alongside the sixth semiconductor region with the first insulating layer interposed therebetween.

10 Claims, 10 Drawing Sheets

(51) Int. Cl.
*H01L 29/10* (2006.01)
*H01L 29/06* (2006.01)
*H01L 27/06* (2006.01)
*H01L 29/36* (2006.01)
*H01L 29/423* (2006.01)
*H01L 29/40* (2006.01)

(52) U.S. Cl.
CPC ...... *H01L 29/0821* (2013.01); *H01L 29/0834* (2013.01); *H01L 29/1095* (2013.01); *H01L 29/36* (2013.01); *H01L 29/407* (2013.01); *H01L 29/4238* (2013.01)

(58) Field of Classification Search
CPC ........... H01L 29/4236; H01L 29/66704; H01L 29/66734; H01L 29/7397; H01L 29/7825; H01L 29/12; H01L 29/78; H01L 21/02378; H01L 21/046; H01L 21/049; H01L 29/41741; H01L 29/517; H01L 29/66068
USPC .......... 257/20, 194, 135–136, 213–413, 900, 257/902–903
See application file for complete search history.

(56) References Cited

U.S. PATENT DOCUMENTS

| | | | |
|---|---|---|---|
| 9,054,152 | B2 | 6/2015 | Ogura et al. |
| 10,147,810 | B2 | 12/2018 | Matsuura |
| 2002/0060330 | A1* | 5/2002 | Onishi ................ H01L 29/0634 257/262 |
| 2004/0043565 | A1* | 3/2004 | Yamaguchi ......... H01L 29/0653 438/268 |
| 2011/0303925 | A1* | 12/2011 | Nishimura ........ H01L 21/26586 257/77 |
| 2012/0068220 | A1* | 3/2012 | Kobayashi .......... H01L 29/0834 257/124 |
| 2014/0027814 | A1 | 1/2014 | Pfirsch |
| 2015/0021657 | A1 | 1/2015 | Ogura et al. |
| 2015/0091055 | A1 | 4/2015 | Gejo et al. |
| 2015/0262999 | A1 | 9/2015 | Ogura |

FOREIGN PATENT DOCUMENTS

| | | |
|---|---|---|
| JP | 5604892 B2 | 10/2014 |
| JP | 2015-023141 | 2/2015 |
| JP | 2015023118 A | 2/2015 |
| JP | 2015072950 A | 4/2015 |
| JP | 2015163357 A | 10/2015 |
| JP | 2015177057 A | 10/2015 |
| JP | 5832670 B2 | 12/2015 |
| JP | 2017041573 A | 3/2017 |

OTHER PUBLICATIONS

Japanese Office Action dated Dec. 2, 2019, mailed in counterpart Japanese Application No. 2016-182773, 6 pages (with translation).

* cited by examiner

US 10,892,351 B2

SEMICONDUCTOR DEVICE

CROSS-REFERENCE TO RELATED APPLICATION

This application is based upon and claims the benefit of priority from Japanese Patent Application No. 2016-182773, filed Sep. 20, 2016, the entire contents of which are incorporated herein by reference.

FIELD

Embodiments described herein generally relate to a semiconductor device.

BACKGROUND

Semiconductor devices such as insulated gate bipolar transistors (IGBTs) include parasitic bipolar transistors (hereafter simply referred to parasitic transistors). In such semiconductor devices, it is desirable to suppress operation of the parasitic transistors.

DETAILED DESCRIPTION

Figure 1:
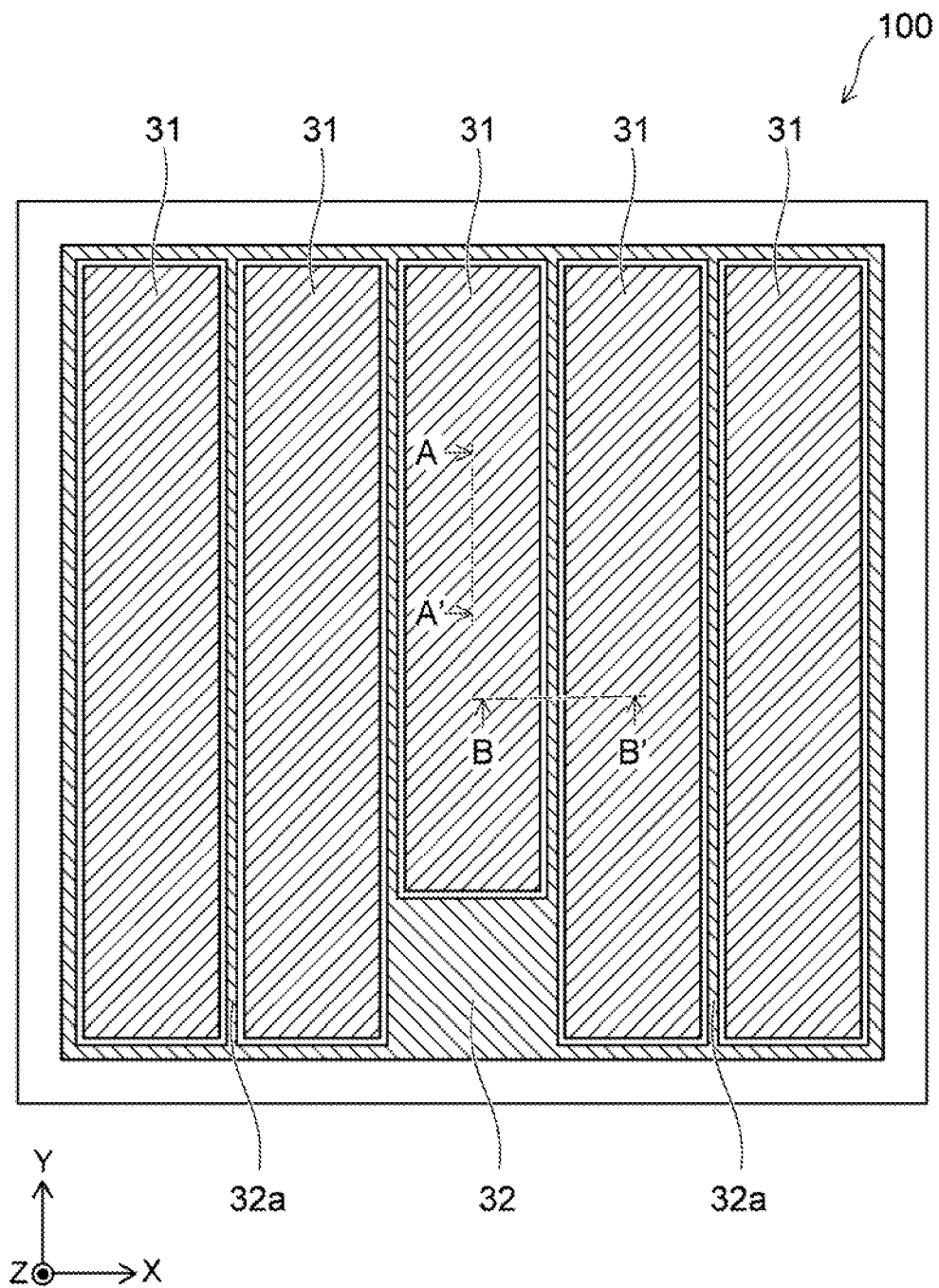
FIG. 1 is a plan view illustrating a semiconductor device according to a first embodiment.

Embodiments provide a semiconductor device in which a parasitic transistor rarely operates.

In general, according to one embodiment, a semiconductor device includes a first semiconductor region of a first conductivity type having a lower surface comprising a first portion and a second portion, a second semiconductor region of a second conductivity type having a second conductivity type, the second semiconductor region located below the first portion of the first semiconductor region, at least a third semiconductor region of the second conductivity type located below the second portion of the first semiconductor region, the third semiconductor region having a second conductivity type carrier concentration that is lower than that of the second semiconductor region, a first electrode located below the second semiconductor region and the third semiconductor region, at least a fourth semiconductor region of the second conductivity type located above the first semiconductor region and the second semiconductor region, a fifth semiconductor region of the first conductivity type located on at least a portion of the fourth semiconductor region, a gate insulating layer, a gate electrode extending alongside the fifth semiconductor region with the gate insulating layer interposed therebetween, a sixth semiconductor region of the second conductivity type located above the first semiconductor region, at least a portion of which is located above the third semiconductor region; a first insulating layer, a second electrode extending alongside the sixth semiconductor region with the first insulating layer interposed therebetween, and a third electrode located above the fourth semiconductor region, the fifth semiconductor region, and the sixth semiconductor region and electrically connected to the fourth semiconductor region, the fifth semiconductor region, the sixth semiconductor region, and the second electrode Hereinafter, embodiments will be described with reference to the drawings.

The drawing figures are schematic and conceptual, and the relationship between a thickness and a width of each portion of the device, a ratio of the sizes between the portions, or the like, may not be the same as those in an actual device. Even when identical portions of the device are shown, the dimensions or relative ratios of the portions may differ.

In the specification and each drawing of the present disclosure, a detailed description of the elements will be omitted, where appropriate, where elements and the like which are given the same reference symbols as elements which have already been described.

Figure 2:
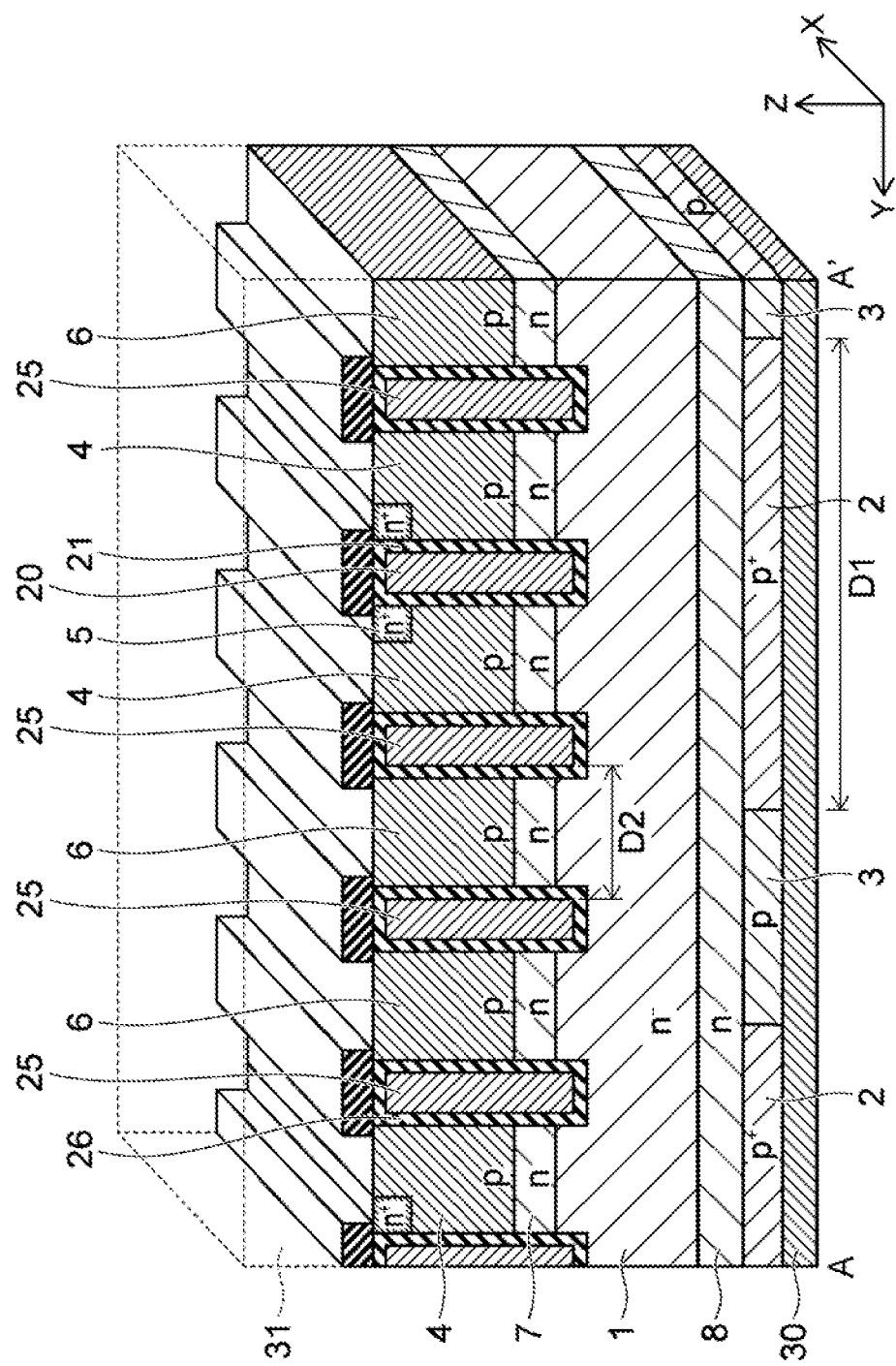
FIG. 2 is a perspective cross-sectional view including a cross section of the line A-A' in FIG. 1.

In the description of each embodiment, an XYZ orthogonal coordinate system is used. The direction from an $n^-$ type semiconductor region 1 toward a p type base region 4 of, for example, FIG. 2, is assumed herein to be the Z direction (third direction) and two directions orthogonal to the Z direction and mutually orthogonal to each other are assumed to be the X direction (second direction) and the Y direction (the first direction).

In the following description, notation of $n^+$, n, $n^-$, and $p^+$, and p indicate a relative magnitude of impurity concentration of each semiconductor dopant conductivity type (n or p). That is, a "+" notation indicates that an impurity concentration of the denoted conductivity type is relatively higher than a same conductivity type to which no notation, or a "−" notation is affixed, and a conductivity type to which a "−" notation is denoted indicates that an impurity concentration of the denoted conductivity type is relatively lower than that of a same conductivity type having no notation or a "+" notation affixed thereto.

In each embodiment to be described below, each embodiment may also be implemented where the p type and n type conductivity types of the semiconductor regions are reversed.

First Embodiment

An example of a semiconductor device 100 according to a first embodiment will be described with reference to FIGS. 1 to 3.

FIG. 1 is a plan view illustrating the semiconductor device 100 according to the first embodiment.

FIG. 2 is a perspective cross-sectional view including a cross section of the line A-A' in FIG. 1.

Figure 3:
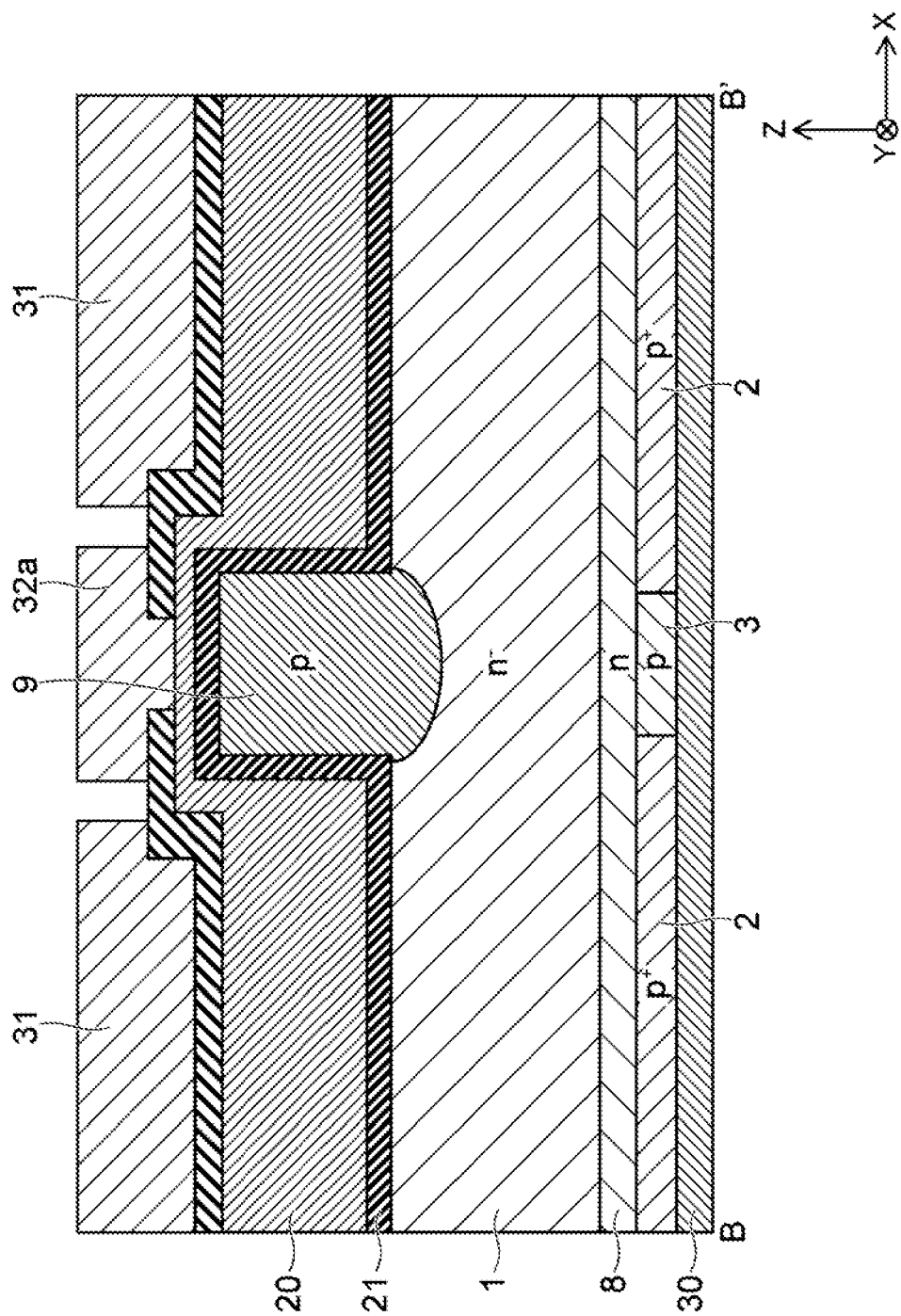
FIG. 3 is a cross-sectional view taken along the line B-B' in FIG. 1.

FIG. 3 is a sectional view taken along the line B-B' in FIG. 1.

In FIG. 2, emitter electrodes 31 are illustrated in a transparent manner, within a phantom outlined upper box shape, to better illustrate the structures thereunder.

The semiconductor device 100 is an IGBT.

As illustrated in FIGS. 1 to 3, the semiconductor device 100 includes an n type (first conductivity type) semiconductor region 1 (first semiconductor region), $p^+$ type (second conductivity type) collector regions 2 (second semiconductor regions), p type collector regions 3 (third semiconductor regions), p type base regions 4 (fourth semiconductor regions), $n^+$ type emitter regions 5 (fifth semiconductor regions), -type semiconductor regions 6 (sixth semiconductor regions), n type barrier regions 7, an n type buffer region 8, a p type semiconductor region 9 (FIG. 3), gate electrodes 20, gate insulation layers 21, field plate electrodes (hereinafter referred to as FP electrodes) 25 (second electrodes), insulating layers 26, a collector electrode 30 (first electrode), emitter electrodes 31 (third electrodes), and a gate pad 32.

As illustrated in FIG. 1, the emitter electrodes 31 and the gate pad 32 are spaced from each other on the upper surface of the semiconductor device 100 in both the X and the Y directions. The plurality of emitter electrodes 31 extend in the X and Y directions and the gate pad 32 includes a plurality of gate wirings 32a extending in the Y direction between, and around, each of the emitter electrodes 31.

As illustrated in FIG. 2, the collector electrode 30 is formed on the lower surface of the semiconductor device 100.

The $p^+$ type collector regions 2 are located on portions of the collector electrode 30 and the p type collector regions 3 are located on portions of the collector electrode 30 where the $p^+$ type collector regions 2 are not located. The $p^+$ collector regions 2 and the p type collector regions 3 are electrically connected to the collector electrode 30. $p^+$ type collector regions 2 and p type collector regions 3 are alternately located or provided in the Y direction, and each extend on the collector electrode 30 in the X direction.

The n type buffer region 8 is formed on the $p^+$ type collector regions 2 and the p type collector regions 3.

The $n^-$ type semiconductor region 1 is formed on the n type buffer region 8.

The p type base regions 4 are located above portions of the $n^-$ type semiconductor region 1 and above the $p^+$ type collector regions 2.

The $n^+$ type emitter regions 5 are selectively formed on the p type base regions 4.

Each of the gate electrodes 20 extend along the side of a p type base region 4 and an $n^+$ type emitter region 5, with the gate insulation layer 21 interposed, in the Y direction therebetween. The gate electrode 20 is connected to a gate wiring 32a of the gate pad 32 through a connection illustrated in FIG. 3.

A plurality of p type base regions 4, $n^+$ type emitter regions 5, and gate electrodes 20 are provided, and sets of gate electrodes 20 having p type base regions 4, $n^+$ type emitter regions 5 on either side thereof in the Y direction, are spaced apart on the $n^-$ type semiconductor region 1 in the Y direction, and each electrode 20, type base region 4 and $n^+$ type emitter region 5 extends in the X direction.

The p-type semiconductor regions 6 are formed over the $n^-$ type semiconductor region 1 in locations where the p type base regions 4, $n^+$ type emitter regions 5, and gate electrodes 20 are not located. The p-type semiconductor regions 6 are located, in part, above the p type collector regions 3. The p type semiconductor regions 6 may be connected to the p type base regions 4 (through a connection not illustrated).

The FP electrodes 25 extend along the sides of the p type semiconductor regions 6 with the insulating layers 26 interposed in the Y direction therebetween.

A plurality of p-type semiconductor regions 6 and FP electrodes 25, in the embodiment illustrated in FIG. 2, two p-type semiconductor regions 6 and FP electrodes 25 are sequentially located along the Y direction, located between two p type base regions 4, and extend in the X direction, respectively.

The gate electrodes 20 are located between the p type base regions 4, in the Y direction, while the FP electrodes 25 are located between the p type base regions 4 and the p type semiconductor regions 6, and between the p type semiconductor regions 6, in the Y direction.

The n-type barrier regions 7 are located between the $n^-$ type semiconductor regions 1 and the p type base regions 4 and between the $n^-$ type semiconductor regions 1 and the p type semiconductor regions 6.

In the example illustrated in FIG. 2, one gate electrode 20 and three FP electrodes 25 are located sequentially in the Y direction from the left to the right of the figure, but the numbers of gate electrodes 20 and FP electrodes 25 sequentially provided may be appropriately changed. The widths and locations of the $p^+$ collector region 2 and the p type collector region 3 in the Y direction are appropriately changed according to the number of sequentially provided, in the Y direction, gate electrodes 20 and FP electrodes 25.

For example, the distance D1 between the p type collector regions 3 in the Y direction is greater than the distance D2 between the gate electrode 20 and the closest FP electrode 25 and between adjacent FP electrodes 25 in the Y direction. The distance D1 between the p type collector regions 3 in the Y direction is defined as an interval between regions having a lower p type impurity concentration than the p type impurity concentration of the $p^+$ type collector region 2.

The p type impurity concentration of the p type collector region 3 is lower than the p type impurity concentration of the $p^+$ type collector region 2, and the total amount of p type impurities in the p type collector region 3 is less than the total amount of p type impurities in the $p^+$ type collector region 2.

To establish this relationship, the p type impurity concentration of the $p^+$ type collector region 2 is set as equal to or greater than $1.0 \times 10^{16}$ atom/cm$^3$ and equal to or less than $1.0 \times 10^{18}$ atom/cm$^3$ and the p type impurity concentration of the p type collector region 3 is set to be equal to or less than ½ of the p type impurity concentration of the $p^+$ type collector region 2. The total amount of p type impurities in the $p^+$ type collector region 2 is set to be equal to or greater than $5.0 \times 10^{12}$ atom/cm$^2$ and equal to or less than $1.0 \times 10^{14}$ atom/cm$^2$, and the total amount of p type impurities in the p type collector region 3 is set to be equal to or greater than $1.0 \times 10^{12}$ atom/cm$^2$ and equal to or less than $1.0 \times 10^{13}$ atom/cm$^2$.

The emitter electrodes 31 are located above the p type base regions 4, the $n^+$ type emitter regions 5, and the p type semiconductor regions 6 and are electrically connected to these semiconductor regions and to the FP electrodes 25. The gate insulation layers 21 are located between the gate electrodes 20 and the emitter electrodes 31 so that these electrodes are electrically isolated from each other.

As illustrated in FIG. 3, a portion of the gate electrodes 20 extend upwardly in the region below the gate wirings 32a and are there connected to the gate wirings 32a. The p type semiconductor region 9 extends upwardly, in the Z direction, from the n type semiconductor region 1 and is located below the gate wiring 32a and isolated from the gate electrodes 20 by the gate insulation layer interposed therebetween.

A p type collector region 3 is also located below the n type buffer layer below the p type semiconductor region 9 and the gate wiring 32a.

FIG. 3 illustrates an example of the case in which the gate electrodes 20 and the gate insulation layers 21 located in the n$^-$ type semiconductor region 1 extend upwardly below the gate wirings 32a. However, the gate electrodes 20 and the gate insulation layers 21 may extend in the X direction below the gate wirings 32a without extending upwardly in that location.

Here, an operation of the semiconductor device 100 will be described.

When a voltage equal to or greater than a voltage threshold value is applied to the gate electrodes 20 in a state in which a voltage which is positive with respect to the emitter electrodes 31 is applied to the collector electrode 30, the semiconductor device 100 enters the ON state. At this time, a channel (inversion layer) is located in a region near the gate insulation layer 21 of the p type base region 4. The electrons are injected from the n$^+$ type emitter region 5 to the n$^-$ type semiconductor region 1 via the channel, and holes are injected from the p$^+$ type collector region 2 and the p type collector region 3 to the n$^-$ semiconductor region 1.

Thereafter, when the voltage applied to the gate electrodes 20 is lowered below the threshold value, the channel in the p type base region 4 disappears and the semiconductor device is turned off.

In a state in which the semiconductor device 100 is turned off and when the voltage which is positive with respect to the emitter electrodes 31 is applied to the collector electrode 30, a depletion layer expands from the insulating layer 26 between the FP electrode an the n$^-$ type semiconductor region 1 into the n$^-$ type semiconductor region 1 because of a potential difference between the FP electrode 25 (which is connected to the emitter electrode 31) and the collector electrode 30. Thus, it is possible to improve breakdown voltage of the semiconductor device 100.

Next, an example of a material of each constituent element will be described.

The n$^-$ type semiconductor region 1, the p$^+$ type collector region 2, the p type collector region 3, the p type base region 4, the n$^+$ type emitter region 5, the p type semiconductor region 6, the n type barrier region 7, the n type buffer region 8, and the p type semiconductor region 9 contain silicon or silicon carbide as a semiconductor material. When silicon is used as the semiconductor material, arsenic, phosphorus, or antimony can be used as n-type impurities. Boron can be used as the p type impurity.

The gate electrode 20 and the FP electrode 25 contain a conductive material such as polysilicon.

The gate insulation layer 21 and the insulating layer 26 contain an electrically insulating material such as silicon oxide.

The collector electrode 30 and the emitter electrode 31 contain metal such as aluminum.

Advantages of the embodiment will now be described.

When a voltage which is large with respect to the emitter electrodes 31 is applied to the collector electrode 30 as a result of a voltage surge, impact ionization occurs adjacent to the bottom portions of the gate insulation layers 21 and bottom portions of the insulating layers 26, and thus electrons and holes are generated in the n$^-$ type semiconductor region 1. The electrons generated by this phenomenon drift toward the collector electrode 30 and decrease the potential of the n$^-$ type semiconductor region 1 immediately above the vicinities of the p$^+$ type collector regions 2 or the p type collector regions 3. The built-in voltage at the junction between the n$^-$ type semiconductor region 1 (and n type buffer 8) and the p$^+$ type collector region 2 or the n$^-$ type semiconductor region (and n type buffer 8) and the p type collector region 3 decreases, and thus holes are injected from the p$^+$ type collector region 2 or the p type collector region 3 into the n type semiconductor region 1.

The degree to which the impact ionization is generated differs for each gate insulation layer 21 and insulating layer 26 due to a variation in the depth or the shape of the gate insulation layer 21 and the insulating layer 26. When the impact ionization is generated mainly in some of the gate insulation layers 21 and the insulating layers 26, current flows intensively in these sites and a current filament is generated. Temperature increases in a location in which the current filament is generated. When the temperature increases, the mean free path of carriers is shortened. Therefore, the impact ionization is rarely maintained. Accordingly, when the temperature increases, the current filament moves to adjacent regions of the device in which the temperature is lower.

When the current filament is generated and the current flowing in the current filament increases, a parasitic transistor including the n$^+$ type emitter regions 5, the p type base regions 4, and the n$^-$ type semiconductor region 1 (the n type barrier region 7) may operate. When the parasitic transistor operates, a larger current locally flows. Therefore, the semiconductor device may break down.

From this viewpoint, in the semiconductor device 100 according to the embodiment, the p$^+$ type collector regions 2 and the p-type collector regions 3 are located below the n$^-$ type semiconductor region 1.

The p type impurity concentration of the p type collector region 3 is lower than the p type impurity concentration of the p$^+$ type collector region 2. Accordingly, when the p$^+$ type collector region 2 or the p type collector region 3 is regarded as an emitter of a pnp bipolar transistor, the n$^-$ type semiconductor region 1 is regarded as the base, and the p type base region 4 or the p type semiconductor region 6 is regarded as the collector, hole injection efficiency in the emitter of the pnp bipolar transistor located above the p type emitter region 3 is lower than that of in the pnp bipolar transistor located above the p$^+$ type collector region 2. Accordingly, when the current filament current is generated, the quantity of holes injected from the p type collector region 3 to the n$^-$ type semiconductor region 1 is smaller than the quantity of holes injected from the p$^+$ type collector region 2 to the n$^-$ type semiconductor region 1. When holes flowing from the p type collector region 3 to the n type semiconductor region 1 are small, the potential of the n$^-$ type semiconductor region 1 located above the p type collector region 3 is lowered and the hole current flows intensively in then$^-$ type semiconductor region 1 above the p type collector region 3. That is, in the n$^-$ type semiconductor region 1 in which the p type collector region 3 is located, there is less resistance to current flow as compared to the region where the p$^+$ type collector region 2 is located.

For this reason, when the current filament moves to or is formed in the location above the p type collector region 3, the current filament rarely moves to another region despite a local increase in temperature where it is occurring. The p type semiconductor region 6 located above the p type collector region 3 faces the FP electrode 25 electrically connected to the emitter electrode 31, and the n$^+$ type emitter region 5 is not located on the p type semiconductor region 6 along the sides of the FP electrodes. That is, the n-p-n parasitic transistor is not formed over the region in which the p type collector region 3 is located.

In this way, according to the embodiment, the current filament easily remains in the region in which no parasitic transistor is located. Therefore, the presence of a current filament in the region where the p type base 4 region is located is not likely, and thus conditions which cause the parasitic transistor to operate are unlikely to occur, and the parasitic transistor rarely operates, and thus it is possible to reduce the possibility of the semiconductor device breaking down.

Since the region in which the gate wiring 32a is located may not be used as an element region in which energization is performed from the collector electrode 30 to the emitter electrode 31, the $n^+$ type emitter region 5 is not located there. Therefore, as illustrated in FIG. 3, by forming the p type collector region 3 even below the gate wiring 32a, a current filament moving or occurring below the gate wiring 32a can be held below the gate wiring 32a and not move into an adjacent semiconductor region and the parasitic transistor can further rarely operate.

First Modification Example

Figure 4:
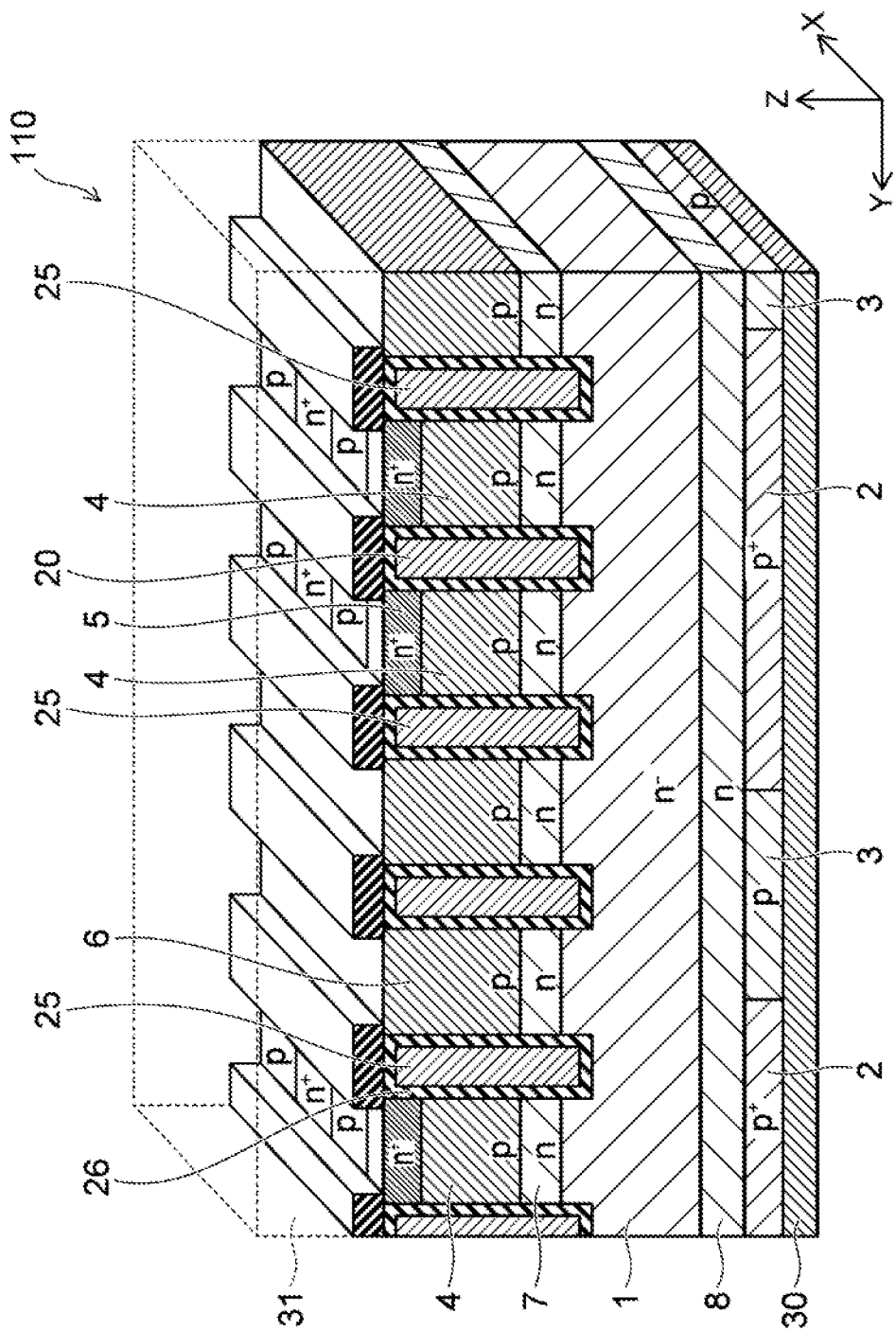
FIG. 4 is a perspective cross-sectional view illustrating a part of a semiconductor device according to a first modification example of the first embodiment.

FIG. 4 is a perspective cross-sectional view illustrating a part of a semiconductor device 110 according to a first modification example of the first embodiment.

In FIG. 4, the emitter electrodes 31 are again illustrated in a transparent manner.

The semiconductor device 110 is different from the semiconductor device 100 in the arrangement of the $n^+$ type emitter regions 5.

Specifically, a plurality of individual $n^+$ type emitter regions 5 are located on the p type base regions 4 and are spaced from each other and aligned with one another in the X direction. That is, the p type base regions 4 and the $n^+$ type emitter regions 5 are alternately located in the X direction between a gate electrode 20 and the FP electrodes on either side thereof in the Y direction. In a region between the $n^+$ type emitter regions 5 in the X direction, a semiconductor region with a p type impurity concentration higher than that of the p type base region 4 may be provided.

Even in the modification example, as in the semiconductor device 100, the p type collector regions 3 are located below portions of the $n^-$ type semiconductor region 1 where the $n^+$ type emitter regions 5 are not located thereover, and the p type semiconductor regions 6 and the FP electrodes 25 are located above the p type collector regions 3. Therefore, because the $n^+$ type emitter regions 5 are not located above the p type collector regions 3, a parasitic transistor rarely operates and it is possible to reduce the possibility of the semiconductor device being broken down.

Second Modification Example

Figure 5:
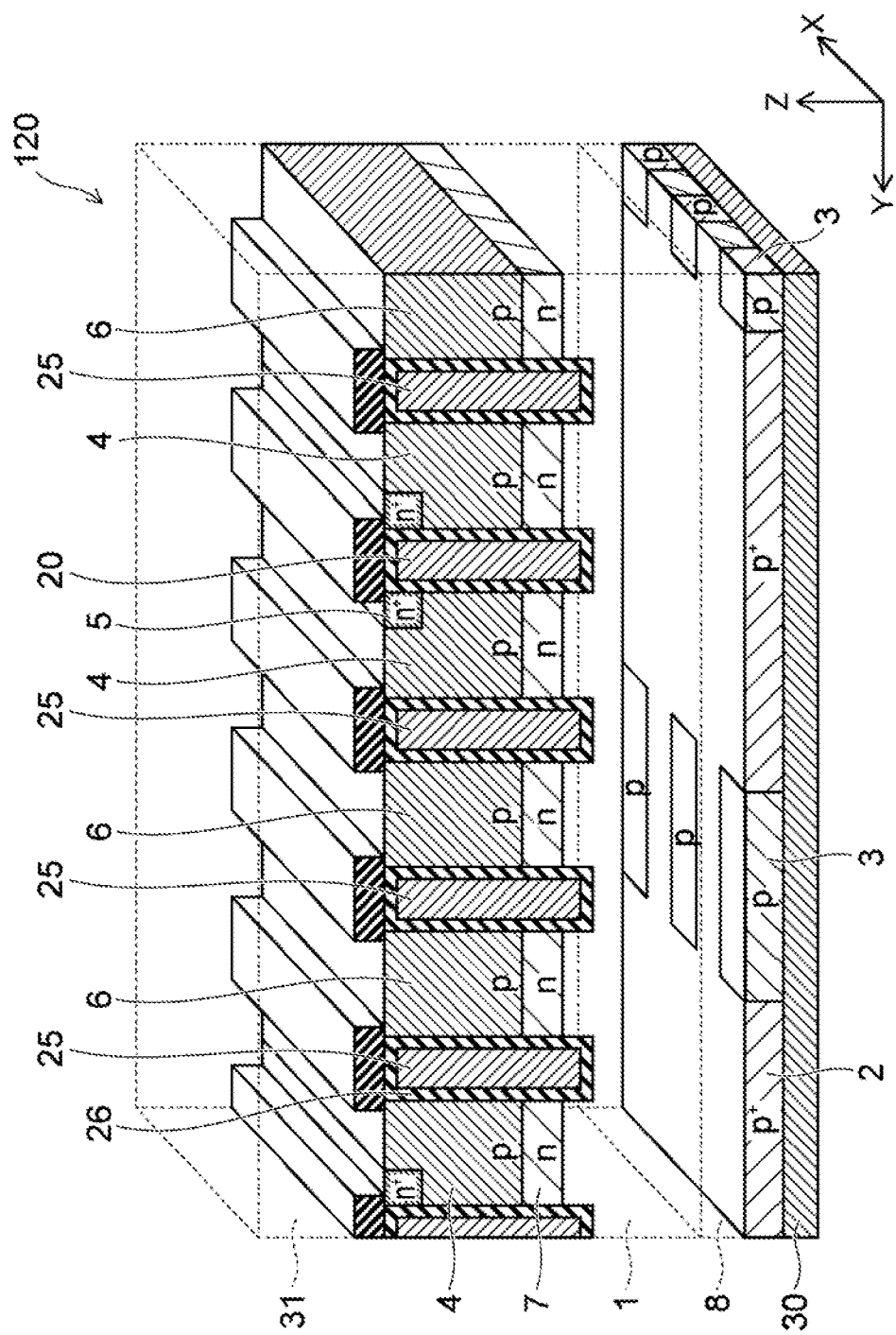
FIG. 5 is a perspective cross-sectional view illustrating a part of a semiconductor device according to a second modification example of the first embodiment.

FIG. 5 is a perspective cross-sectional view illustrating a part of a semiconductor device 120 according to a second modification example of the first embodiment.

In FIG. 5, the $n^-$ type semiconductor region 1, the n type buffer region 8, and the emitter electrode 31 are here illustrated in a transparent manner.

The semiconductor device 120 is different from the semiconductor device 100 in arrangement of the p type collector regions 3.

Specifically, the plurality of p-type collector regions 3 are spaced from each other in the X and Y directions. That is, in the region below the p type semiconductor regions 6, $p^+$ type collector regions 2 the p type collector regions 3 are alternately located in the X direction below.

As described above, a current filament moving to a region in which the p type collector region 3 is formed rarely moves therefrom to a region in which the $p^+$ type collector region 2 is formed. However, the current filament will moves within the region in which the p type collector region 3 is formed. A plurality of current filaments may be generated in the semiconductor device, and the location of each current filament may move in the semiconductor device.

Accordingly, there is a possibility that a current filament is formed or moves into the region in which the p type collector region 3 is formed, and a plurality of current filaments move from other portions of the p type collector region into the same portion thereof, and thus a large current filament current will flow potentially leading to breakdown of the device. The $n^+$ type emitter regions 5 are not formed above the p type collector regions 3, but a large current may still locally flow. Thus, there is a possibility that the temperature of the semiconductor device can significantly increase and thermal runaway occurs.

From this viewpoint, in the modification example, a plurality of p type collector regions 3 are formed below the p type semiconductor regions 6 and are spaced from each other in the X direction. Therefore, the current filaments are held in the individual p-type collector regions 3 in a distributed state, and thus an increase in a current density due to the current filaments joining together in a specific location can be suppressed. As a result, it is possible to suppress the occurrence of thermal runaway in the semiconductor device.

Second Embodiment

Figure 6:
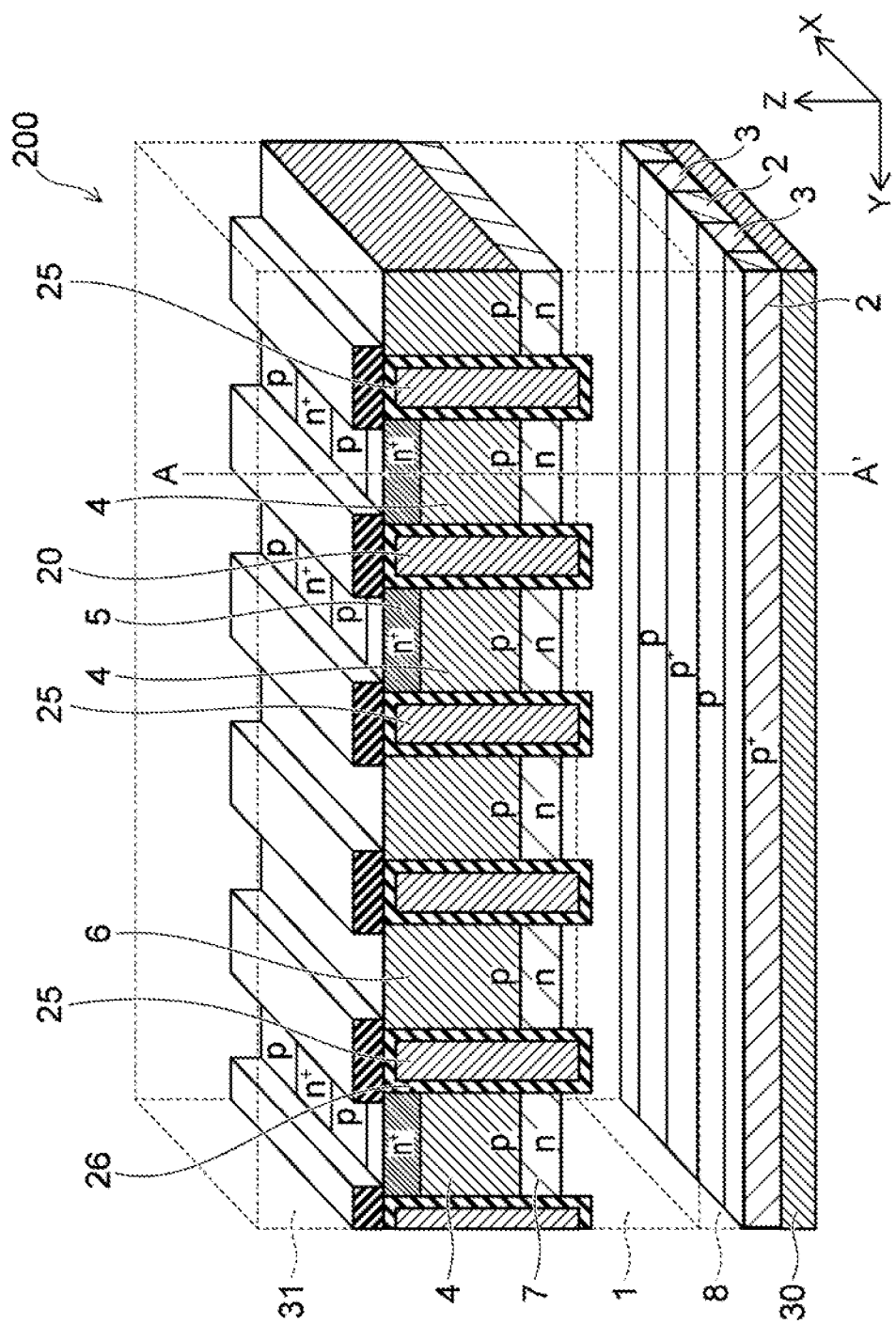
FIG. 6 is a perspective cross-sectional view illustrating a part of a semiconductor device according to a second embodiment.

FIG. 6 is a perspective cross-sectional view illustrating a part of a semiconductor device 200 according to a second embodiment.

Figure 7:
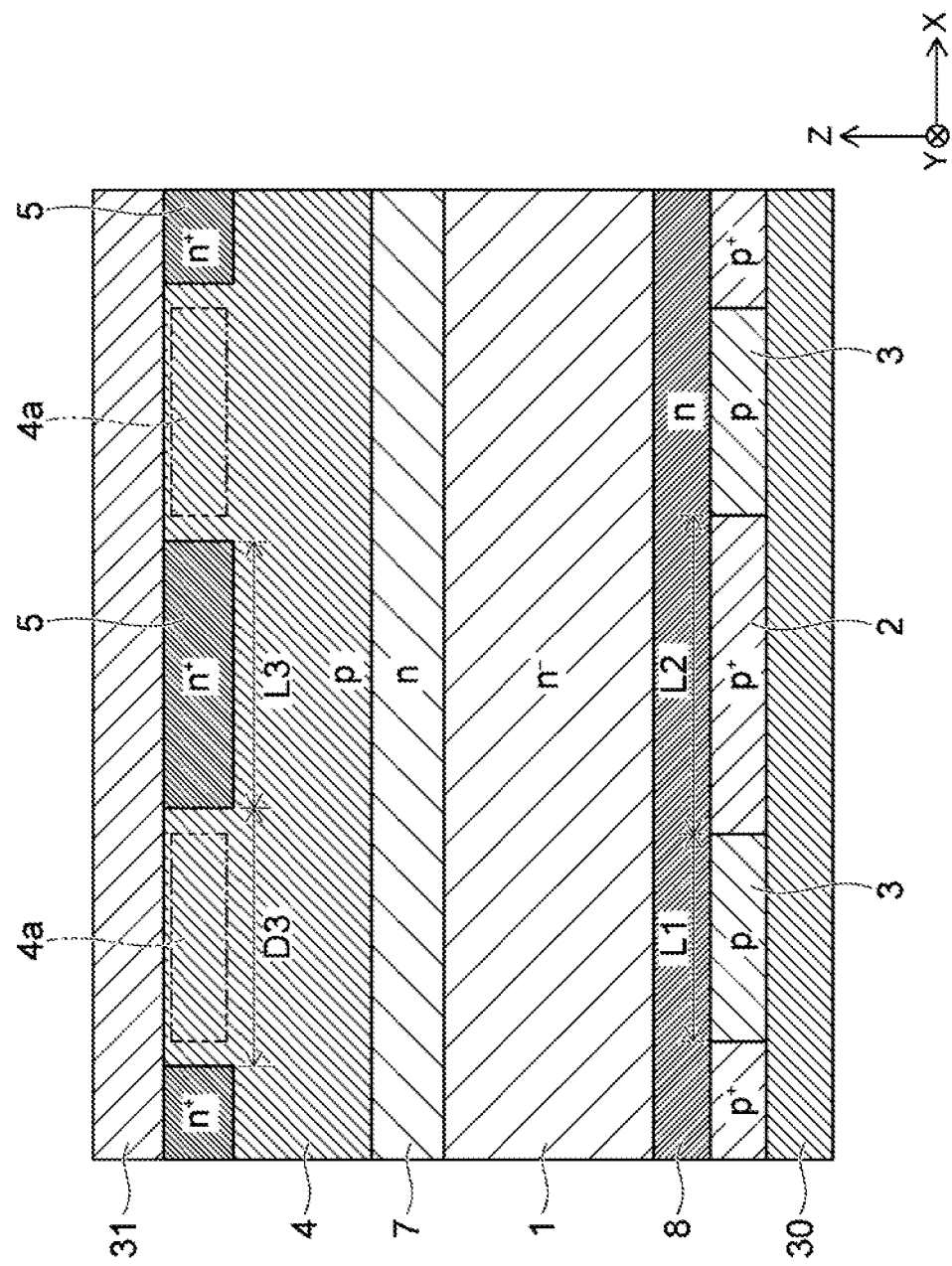
FIG. 7 is a cross-sectional view illustrating an X-Z plane including the line A-A' in FIG. 6.

FIG. 7 is a sectional view illustrating an X-Z plane including the line A-A' in FIG. 6.

In FIG. 6, the n type semiconductor region 1, the n type buffer region 8, and the emitter electrode 31 are again illustrated in a transparent manner.

The semiconductor device 200 is different from the semiconductor device 110 in the arrangement of the $p^+$ type collector regions 2 and the p type collector regions 3.

As illustrated in FIG. 6, strips of the $p^+$ type collector regions 2 and the p type collector regions 3 extending in the Y direction, and alternating in the X direction, are formed below the n type semiconductor region 1.

As illustrated in FIG. 7, the p type base region 4 includes first portions 4a. The first portions 4a are aligned with the $n^+$ type emitter regions 5 in the X direction, and the first portions 4a and the $n^+$ type emitter regions 5 are alternately located and aligned in the X direction. The first portions 4a are located above the p type collector regions 3 and the $n^+$ type emitter regions 5 are located above the $p^+$ type collector regions 2. The p type impurity concentration in the first portion 4a may be higher than the p type impurity concentration in the p type base region 4 located below the $n^+$ type emitter region 5 and the first portion 4a.

A length L1 in the X direction of the p type collector regions 3 is shorter than the distance D3 between the $n^+$ type emitter regions 5 in the X direction. A length L2 in the X direction of the $p^+$ type collector region 2 is longer than a length L3 of the $n^+$ type emitter region 5 in the X direction.

In the embodiment, the p type base regions 4 and the gate electrodes 20 are formed above the p type collector regions 3. However, the first portions 4a of the p type base region 4 are formed immediately above the p type collector regions 3, and the first portions 4a are aligned with the $n^+$ type emitter regions 5 in the X direction. That is, the $n^+$ type emitter regions 5 are not formed immediately above the p type collector regions 3 and thus the parasitic transistor does not likely function. Therefore, according to the embodiment, as in the first embodiment, the parasitic transistor rarely operates, whereby it is possible to reduce the possibility of the semiconductor device being broken down.

Modification Examples

Figure 8:
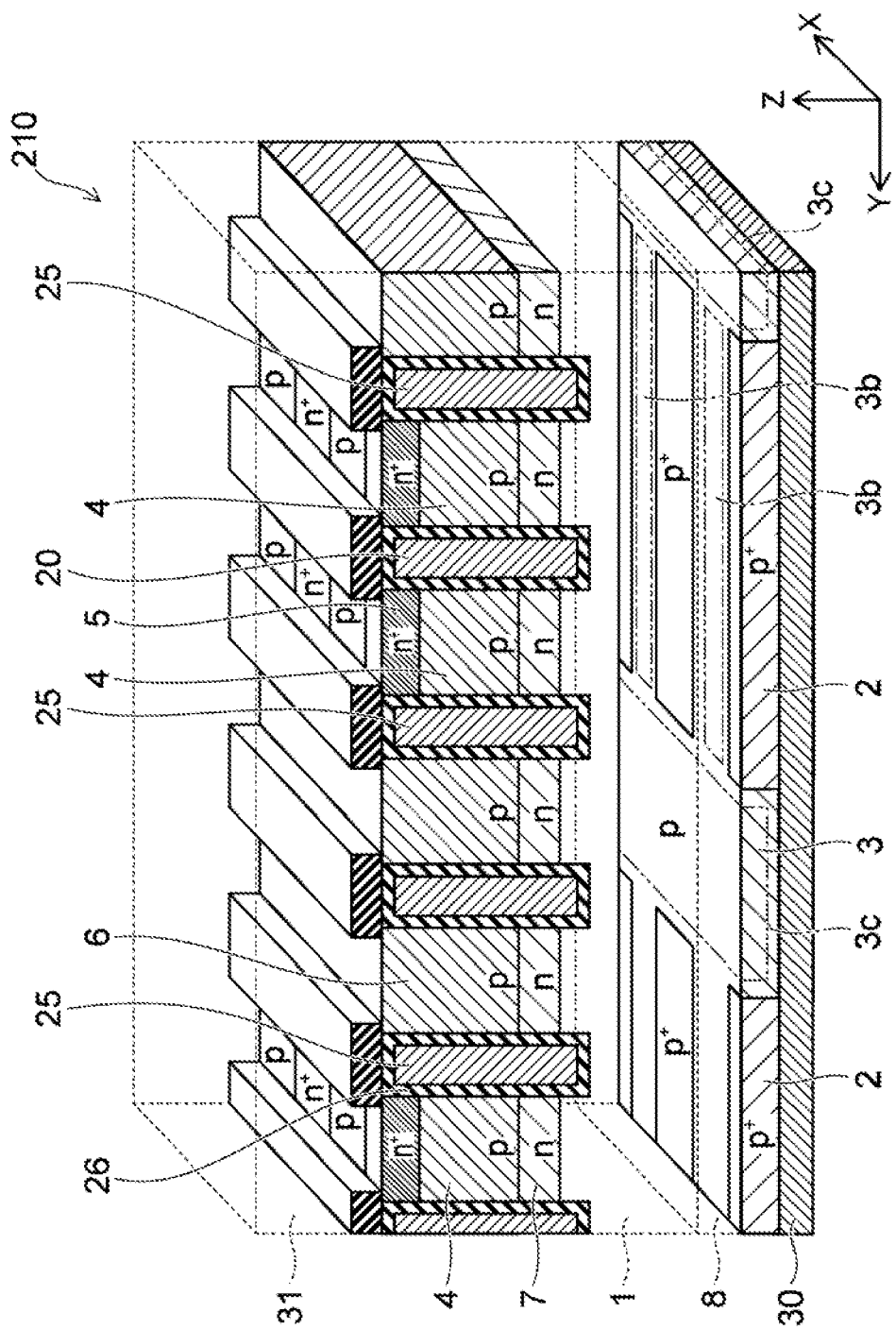
FIG. 8 is a perspective cross-sectional view illustrating a part of a semiconductor device according to a modification example of the second embodiment.

FIG. 8 is a perspective cross-sectional view illustrating a part of a semiconductor device 210 according to a modification example of the second embodiment.

In FIG. 8, the n type semiconductor region 1, the n type buffer region 8, and the emitter electrode 31 are again illustrated in a transparent manner.

The semiconductor device 210 is different from the semiconductor device 200 in that the p type collector regions 3 extend in the X direction below the p type semiconductor regions 6.

As illustrated in FIG. 8, the p type collector region 3 includes second portions 3b and third portions 3c. The second portions 3b are formed between the $p^+$ type collector regions 2 in the X direction and extend in the Y direction. In the X direction, the second portions 3b and the $p^+$ type collector regions 2 are alternately located in the X direction such that the second portions extend below the p type regions 4a located between the adjacent $n^+$ type emitter regions 5 in the X direction. The third portions 3c extend in the X direction below the p type semiconductor regions 6 and the FP electrodes 25 and connect to the ends of the plurality of second portions 3b extending in the Y direction. The plurality of $p^+$ type collector regions 2 are located between the third portions 3c in the Y direction. For example, the length of the second portion 3b in the X direction is shorter than the length of the third portion 3c, and thus of the plurality of $p^+$ type collector regions 2, in the Y direction.

In this way, the p type collector regions 3 (3b, 3c) are formed below portions of the first portions 4a and also below the p type semiconductor regions 6, and thus the collective area of the p type collector regions 3 is increased. Further, when current filaments generated in the semiconductor device move, the current filaments more easily move to the location above the p type collector regions 3 and not onto the locations of the $p^+$ type collector regions 2 below the $n^+$ type emitter regions 5. The plurality of second portions 3b are connected by the third portions 3c, and thus a region in which the current filament can move inside the p-type collector region 3 without being below the $n^+$ type emitter regions is expanded.

As described above, the $n^+$ type emitter regions 5 are not formed above the second portions 3b of the p-type collector regions 3 and the parasitic transistor rarely functions. However, a slight amount of holes injected to the $n^-$ type semiconductor region 1 is discharged via the $n^+$ type emitter regions 5. When a large current continuously flows in the p type base region 4 due to the current filament, the temperature of the p-type base region 4 increases and a built-in potential between the $n^+$ type emitter region 5 and the p type base region 4 is lowered. When the temperature of the semiconductor region increases, the current filament moves to another location. When a region to which the current filament can be moved is narrow, the current filament moves again while the temperature is not sufficiently lowered after the movement of the current filament. As a result, the parasitic transistor may operate.

When the plurality of second portions 3b are connected by the third portions 3c, the region to which the current filament can move is expanded. Therefore, even when the current filament moves to another location and moves back to the same location again, the period of time between the residence of the current filament at a specific location can be lengthened and the temperature of a location in which the current filament is generated can be sufficiently lowered.

Therefore, according to the modification example, the parasitic transistor further rarely functions and it is possible to further reduce the possibility of the semiconductor device being broken down than in the semiconductor device 200.

Third Embodiment

Figure 9:
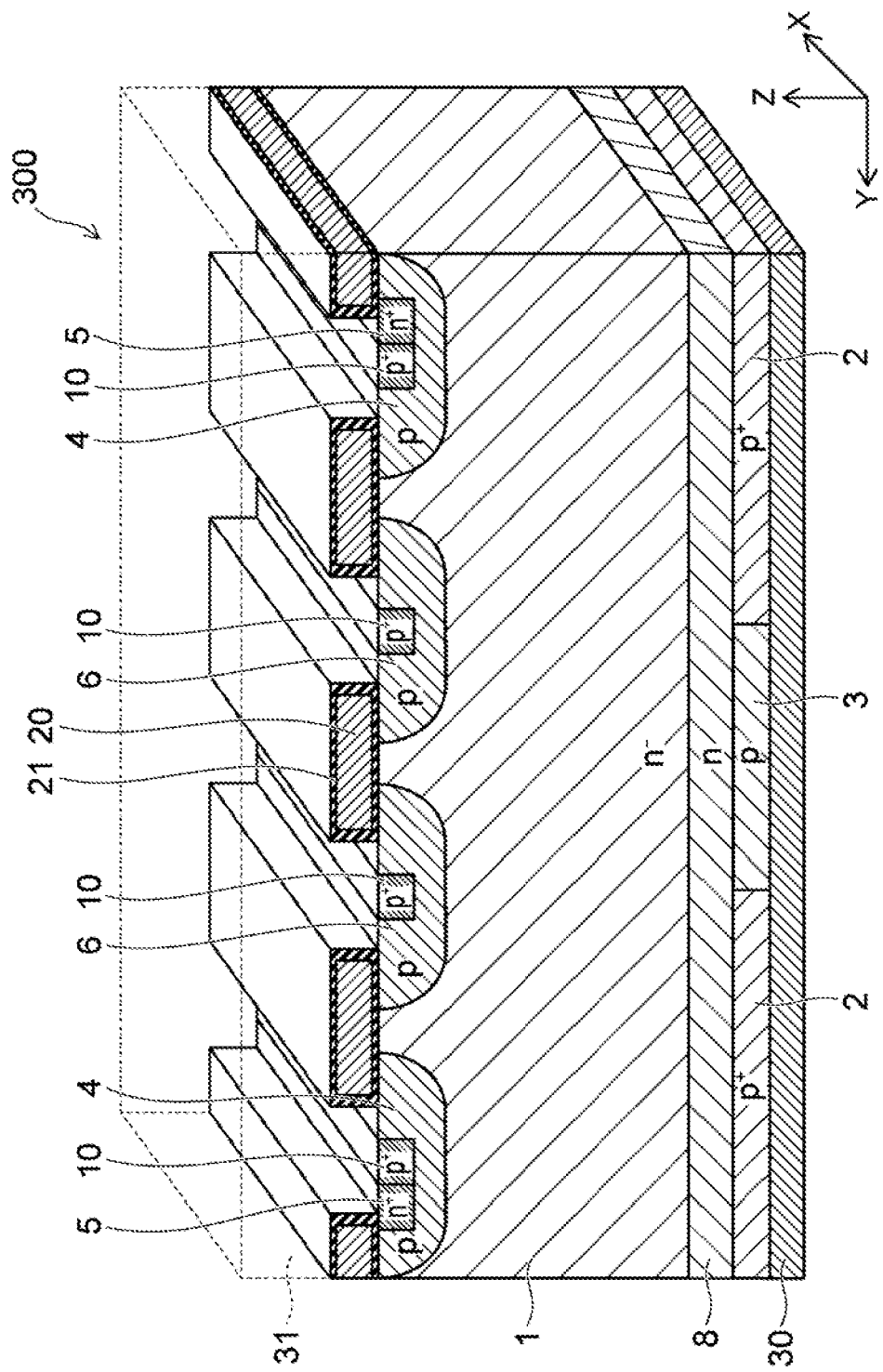
FIG. 9 is a perspective cross-sectional view illustrating a part of a semiconductor device according to a third embodiment.

FIG. 9 is a perspective cross-sectional view illustrating a part of a semiconductor device 300 according to a third embodiment.

In FIG. 9, the emitter electrode 31 is illustrated in a transparent manner.

The semiconductor device 300 has a planar gate structure in which the gate electrode 20 is formed above the semiconductor region.

The collector electrode 30, the $p^+$ type collector regions 2, the p type collector regions 3, and the n type buffer region 8 are formed below the $n^-$ type semiconductor region 1, as in the semiconductor device 100.

The p type base regions 4 are formed on portions of the $n^-$ type semiconductor region 1, extend in the X direction, and are located above the $p^+$ type collector regions 2. The $n^+$ type emitter regions 5 and $p^+$ type contact regions 10 are selectively formed on the p type base regions 4. The $n^+$ type emitter region 5 is not formed on the p type semiconductor region 6 of the p type base region 4.

The p-type semiconductor regions 6 are formed on portions of the $n^-$ type semiconductor region 1 between p type base regions 4. At least a portion of each of the p type semiconductor regions 6 is located above the p type collector region 3, the $p^+$ type contact region 10 is selectively located on the p type semiconductor region 6, and the $n^+$ type emitter region 5 is not provided in the p type semiconductor region 6.

Gate electrodes 20 are individually formed on adjacent the p type base regions 4 and the p-type semiconductor regions 6, as well as on adjacent p-type semiconductor regions 6, with the gate insulation layer 21 interposed therebetween to faces these semiconductor regions in the Z direction.

The $p^+$ type collector regions 2 and the p type collector regions 3 are alternately located on the electrode 30 in the Y direction, and they each extend in the X direction. The individual ones of the plurality of p type base regions 4, the plurality of $n^+$ type emitter regions 5, the plurality of p type semiconductor regions 6, the plurality of $p^+$ type contact regions 10, and the plurality of gate electrodes 20 are spaced apart in the Y direction and extend in the X direction.

The $n^+$ type emitter regions 5 are not provided immediately above the p type collector regions 3 and thus no parasitic transistor can be formed there. Therefore, according to the embodiment, as in the other embodiments, a parasitic transistor rarely functions and it is possible to reduce the possibility of the semiconductor device being broken down.

Modification Examples

Figure 10:
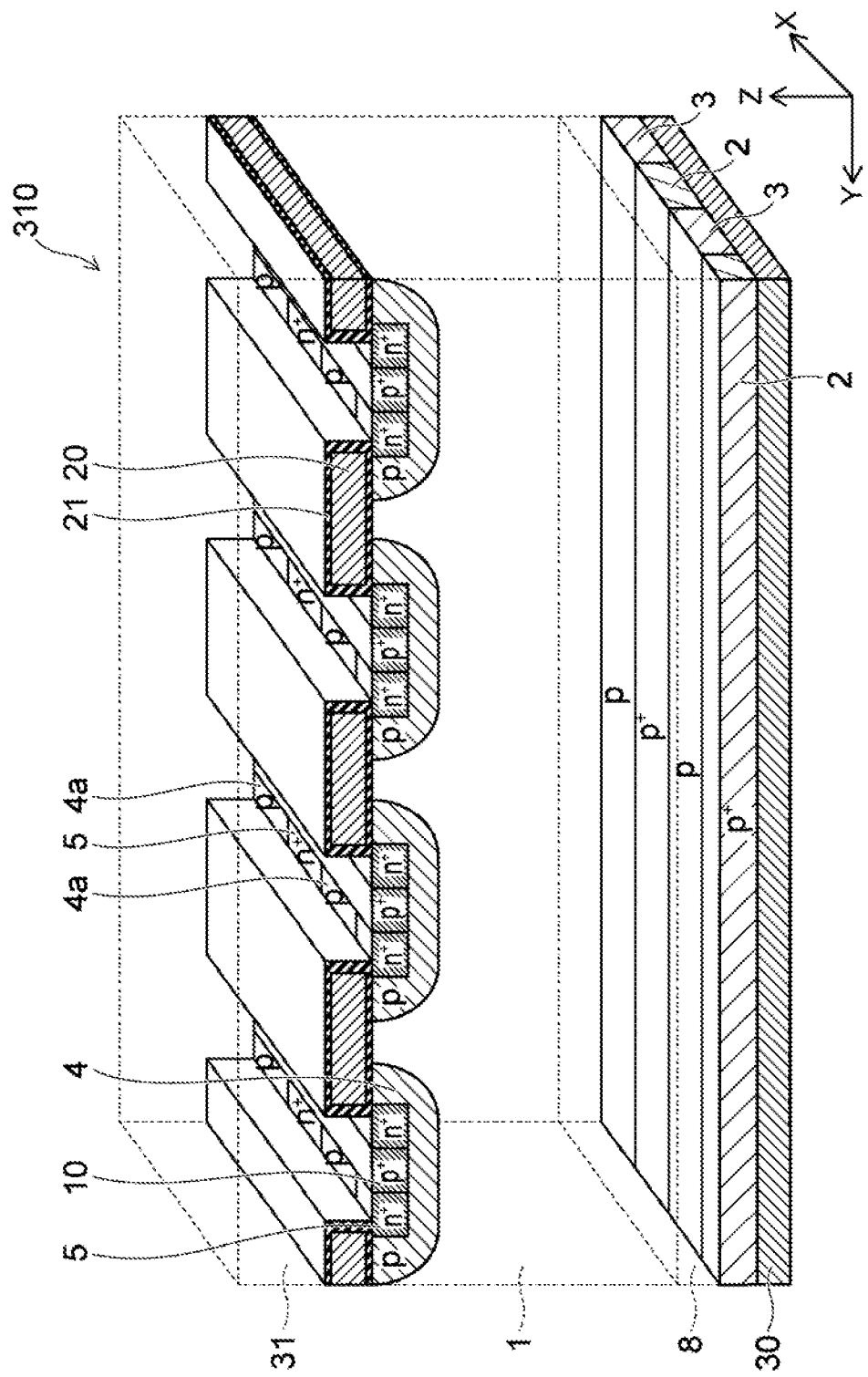
FIG. 10 is a perspective cross-sectional view illustrating a part of a semiconductor device according to a modification example of the third embodiment.

FIG. 10 is a perspective cross-sectional view illustrating a part of a semiconductor device 310 according to a modification example of the third embodiment.

In FIG. 10, the emitter electrode 31 and the n⁻ type semiconductor region 1 are illustrated in a transparent manner.

In the semiconductor device 310, the p⁺ type collector regions 2 and the p type collector regions 3 extend in the Y direction and are alternately provided in the X direction. Instead of the p type semiconductor regions 6, p type base regions 4 are provided. A plurality of aligned, in the X direction, n⁺ type emitter regions 5 and p type first regions 4a are provided, and a plurality of these aligned groups or sets of n⁺ type emitter regions 5 and p type regions are spaced apart in the Y direction. A portion of the p⁺ type contact region 10 is formed between the n⁺ type emitter regions 5 in the Y direction. The n⁺ type emitter regions 5 are spaced from each other in the X direction. The n⁺ type emitter regions 5 and the first portions 4a of the p type base regions 4 are alternately formed in the X direction. The first portions 4a are located above the p type collector regions 3 and the n⁺ type emitter regions 5 are located above the p⁺ type collector regions 2.

Even in the modification example, parasitic transistor is not present immediately above the p type collector region 3. Therefore, it is possible to reduce the possibility of the semiconductor device being broken down.

In the above-described embodiments, the relative magnitude in the impurity concentration between the semiconductor regions can be confirmed using, for example, a scanning capacitance microscopy (SCM). A carrier concentration in each semiconductor region can be considered to be the same as an impurity concentration activated in each semiconductor region. Accordingly, a relative magnitude in the carrier concentration between the semiconductor regions can be confirmed using an SCM.

The impurity concentration in each semiconductor region can be measured by using, for example, a secondary ion mass spectrometry (SIMS).

The above-described embodiments can be modified in various forms. For example, a plurality of p⁻ type semiconductor regions may be formed in the n⁻ type semiconductor region 1 and a super-junction structure may be formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. From technologies of related art, a person skilled in the art can appropriately select specific configurations of the respective elements included in the embodiments, for example, the n⁻ type semiconductor region 1, the p⁺ type collector regions 2, the p type collector regions 3, the p type base regions 4, the n⁺ type emitter regions 5, the p type semiconductor regions 6, the n type barrier regions 7, the n type buffer region 8, the p-type semiconductor region 9, the p⁺ type contact regions 10, the gate electrodes 20, the gate insulation layers 21, the FP electrodes 25, the insulating layers 26, the collector electrode 30, the emitter electrodes 31, and the gate pad 32. The accompanying claims and their equivalents are intended to cover such forms or modifications as would fall within the scope and spirit of the inventions. The respective embodiments described above may be implemented by combination.

What is claimed is:

1. A semiconductor device comprising:
a first semiconductor region of a first conductivity type having a lower surface comprising a first portion and a second portion;
a second semiconductor region of a second conductivity type, the second semiconductor region below the first portion of the first semiconductor region;
a third semiconductor region of the second conductivity type below the second portion of the first semiconductor region, the third semiconductor region having a second conductivity type carrier concentration that is lower than that of the second semiconductor region;
a first electrode below, and directly adjacent, the second semiconductor region and the third semiconductor region;
a fourth semiconductor region of the second conductivity type above the first portion of the first semiconductor region;
a fifth semiconductor region of the first conductivity type on a portion of the fourth semiconductor region;
a gate insulating layer;
a gate electrode extending alongside the fourth semiconductor region with the gate insulating layer therebetween;
a sixth semiconductor region of the second conductivity type above the first portion and the second portion of the first semiconductor region;
a first insulating layer;
a second electrode extending alongside the sixth semiconductor region with the first insulating layer interposed therebetween; and
a third electrode above the fourth semiconductor region, the fifth semiconductor region, and the sixth semiconductor region and electrically connected to the fourth semiconductor region, the fifth semiconductor region, the sixth semiconductor region, and the second electrode.

2. The device according to claim 1, wherein
the gate electrode and the second electrode are spaced from each other in a first direction, and
a plurality of second semiconductor regions and a plurality of third semiconductor regions are alternately located in the first direction.

3. The device according to claim 1, wherein
the gate electrode and the second electrode are spaced from each other in a first direction, and
a first plurality of third semiconductor regions are below the second portion of the first semiconductor region and are spaced from each other in a second direction intersecting the first direction.

4. The semiconductor device of claim 3, wherein
a first portion of the second semiconductor region extends in the first direction between an adjacent pair of the first plurality of third semiconductor regions below the second portion of the first semiconductor region, and
a second portion of the second semiconductor region is below the second portion of the first semiconductor region.

5. The semiconductor device according to claim 4, wherein the fifth semiconductor region includes a first portion and a second portion, the first portion of the fifth semiconductor region overlying the first portion of the second semiconductor region, and the second portion of the fifth semiconductor region not overlying the first portion of the second semiconductor region.

6. The semiconductor device of claim 5, wherein the first and second portions of the fifth semiconductor region extend in the second direction between the gate insulating layer and the first insulating layer.

7. The semiconductor device of claim 3, wherein
a plurality of fourth semiconductor regions are spaced apart from each other in the first direction and the sixth semiconductor region is between an adjacent pair of the plurality of fourth semiconductor regions in the first direction; and
the first plurality of third semiconductor regions do not extend below the plurality of fourth semiconductor regions.

8. The semiconductor device of claim 3, wherein
a plurality of fourth semiconductor regions are spaced apart from each other in the first direction and the sixth semiconductor region is between an adjacent pair of the plurality of fourth semiconductor regions in the first direction;
a second plurality of third semiconductor regions, extending in the second direction, are an end of the first plurality of third semiconductor regions in the first direction; and
each of the second plurality of third semiconductor regions is below the sixth semiconductor region and does not extend below the fourth semiconductor region.

9. The semiconductor device of claim 1, wherein the first semiconductor region comprises a first sub region having a first impurity concentration, and a second sub region over the first sub region, and having a lower impurity concentration than the first sub region.

10. A semiconductor device, comprising:
a first semiconductor region of a first conductivity type, the first semiconductor region having a first surface portion and a second surface portion;
a second semiconductor region of a second conductivity type, the second semiconductor region being below the first surface portion in a first direction;
a third semiconductor region of the second conductivity type below the second surface portion in the first direction, the third semiconductor region having a second conductivity type carrier concentration that is lower than that of the second semiconductor region;
a first electrode below and adjacent to the second semiconductor region and the third semiconductor region;
a fourth semiconductor region of the second conductivity type above the first surface portion in the first direction;
a fifth semiconductor region of the first conductivity type on a portion of the fourth semiconductor region;
a gate electrode extending along a side of the fourth semiconductor region;
a gate insulating layer between the gate electrode and the fourth semiconductor region;
a sixth semiconductor region of the second conductivity type above the first surface portion and the second surface portion in the first direction;
a second electrode extending along a side of the sixth semiconductor region;
a first insulating layer between the second electrode and the side of the sixth semiconductor region; and
a third electrode above, in the first direction, the fourth semiconductor region, the fifth semiconductor region, and the sixth semiconductor region, the third electrode being electrically connected to the fourth semiconductor region, the fifth semiconductor region, the sixth semiconductor region, and the second electrode.

\* \* \* \* \*